(12) United States Patent
Lee et al.

(10) Patent No.: US 6,204,125 B1
(45) Date of Patent: Mar. 20, 2001

(54) METHOD OF FORMING A GATE IN A STACK GATE FLASH EEPROM CELL

(75) Inventors: Keun Woo Lee; Ki Seog Kim, both of Kyungki-Do; Jin Shin, Seoul; Sung Kee Park, Kyungsangbuk-Do, all of (KR)

(73) Assignee: Hyundai Electronics Industries Co., Ltd., Ichon-Shi (KR)

( * ) Notice: Subject to any disclaimer, the term of this patent is extended or adjusted under 35 U.S.C. 154(b) by 0 days.

(21) Appl. No.: 09/605,632

(22) Filed: Jun. 28, 2000

(30) Foreign Application Priority Data

Jun. 28, 1999 (KR) .................................... 99-24886

(51) Int. Cl.[7] .............................................. H01L 21/8247
(52) U.S. Cl. ........................................ 438/264; 438/594
(58) Field of Search ................................. 438/257–267, 438/593–594

(56) References Cited

U.S. PATENT DOCUMENTS

| | | | |
|---|---|---|---|
| 4,982,250 | * 1/1991 | Manos, II et al. | |
| 5,210,047 | 5/1993 | Woo et al. | ............................... 437/43 |
| 5,256,584 | * 10/1993 | Hartmann . | |
| 5,731,242 | * 3/1998 | Parat et al. | ............................. 438/586 |
| 5,796,141 | 8/1998 | Lin et al. | ............................... 257/316 |
| 5,801,076 | 9/1998 | Ghneim et al. | ....................... 438/261 |
| 5,851,879 | 12/1998 | Lin et al. | ............................... 438/257 |
| 5,918,125 | * 6/1999 | Guo et al. | ............................. 438/264 |
| 5,998,264 | 12/1999 | Wu | ......................................... 438/260 |
| 6,136,657 | * 10/2000 | Yang et al. | ........................... 438/303 |

FOREIGN PATENT DOCUMENTS

| | | |
|---|---|---|
| 8-330457 | 12/1996 | (JP) . |
| 11-54633 | 2/1999 | (JP) . |

* cited by examiner

*Primary Examiner*—Richard Booth
(74) *Attorney, Agent, or Firm*—Pennie & Edmonds LLP

(57) ABSTRACT

The present invention relates to a method of forming a gate in a stack gate flash EEPROM cell. In order to preventing a lateral bird's beak from occurring in an ONO dielectric layer during a reoxidation process to be performed after a formation of a cell gate having a stack structure formed by stacking a floating gate, an ONO dielectric layer and a control gate, an oxide layer and a nitride layer are sequentially formed on an entire structure before the reoxidation and after a formation of the cell gate. The oxide layer serves to reduce a stress in depositing the nitride layer, and the nitride layer serves to prevent an occurrence of the lateral bird's beak of the ONO dielectric layer during the reoxidation process. Accordingly, the present invention prevents the lateral bird's beak of the ONO dielectric layer, thereby improving a speed of cell erase operation.

7 Claims, 1 Drawing Sheet

METHOD OF FORMING A GATE IN A STACK GATE FLASH EEPROM CELL

BACKGROUND OF THE INVENTION

1. Field of the Invention

The present invention relates to a method of forming a gate in a stack gate flash EEPROM cell and more particularly, to a method of forming a gate in a stack gate flash EEPROM cell capable of improving an erase operation speed by reducing a lateral bird's beak of an ONO dielectric layer and increasing a coupling ratio, wherein the lateral bird's beak occurs during a reoxidation process to be performed after a formation of a cell gate having a stack structure formed by stacking a floating gate, an ONO dielectric layer and a control gate.

2. Description of the Prior Art

Hereinafter, a method of forming a gate in a conventional stack gate flash EEPROM cell will be described with reference to FIG. 1.

In FIG. 1A, there is shown a method of forming a gate in a stack gate flash EEPROM cell. Referring to FIG. 1A, a stack gate having a stack structure of a floating gate 3 and a control gate 5 is formed on a semiconductor substrate 1. A tunnel oxide layer 2 is formed between the floating gate 3 and the semiconductor substrate 1. A dielectric layer 4 is formed between the floating gate 3 and the control gate 5. An ONO structure is generally applicable to the dielectric layer 4.

In FIG. 1B there is shown a cross-sectional view of the dielectric layer 4 of ONO structure. Referring to FIG. 1B, the dielectric layer 4 is formed with a lower oxide layer 4a, a nitride layer 4b and an upper oxide layer 4c. In the conventional method of forming a cell gate, however, in order to reduce a damage after forming a cell gate, a reoxidation process is carried out at a temperature of 850° C. At this point, polysilicons adjacent to the ONO structure of the dielectric layer 4 are oxidized, and, as shown in FIG. 1B, the thickness of the lower and upper oxide layers 4a and 4c of the ONO dielectric layer 4 becomes thick. Consequently, the lateral bird's beak 4d occurs.

It is supposed that the causes of the lateral bird's beak is due to an etching damage occurring adjacent to the ONO dielectric layer 4 during an etching process for forming a cell gate as well as an oxidation of the polysilicon in a boundary region between oxide layers 4a and 4c constituting the ONO dielectric layer 4 and gates 3 and 5 formed of the polysilicon during the reoxidation process. Since a capacitance is inversely proportional to a thickness of an insulating material, as the thickness of the ONO dielectric layer 4 is increasing, a value of the capacitance is decreased, thereby reducing a coupling ratio. In the cell operation, the coupling ratio is a very important factor.

For example, if a voltage of 10 V is applied to the control gate, when the coupling ratio is 0.5, the voltage applied to the floating gate becomes 5 V. Hence as the coupling ratio becomes increasing, the voltage applied to the floating gate is increased. This plays an important role in a cell erase operation. The cell erase generally employs the F-N tunneling. Since the voltage applied to the floating gate is increased as the coupling ratio becomes larger, it is advantageous to F-N tunnel the electrons on the floating gate to a channel region or source region. Since the coupling ratio is decreased due to an increase of the thickness in the ONO dielectric layer caused by the lateral bird's beak, the cell erase operation speed is lowered. Consequently, it causes a deterioration of the entire cell erase operation speed. A desirable cell erase operation speed can be obtained when the coupling ratio of cell is above 0.6.

SUMMARY OF THE INVENTION

It is, therefore, an object of the present invention to provide a method of forming a gate in a stack gate flash EEPROM cell capable of solving the above problems by increasing a coupling ratio through a reduction of a lateral bird's beak of an ONO dielectric layer.

In order to achieve the object of the present invention, a method of forming a gate in a stack gate flash EEPROM cell comprises the steps of forming a cell gate having a stack structure, wherein the stack structure has a tunnel oxide layer, a floating gate, a dielectric layer and a control gate stacked on a semiconductor substrate; forming an oxide layer as a first barrier layer on an entire upper portion including said cell gate; forming a nitride layer as a second barrier layer on an upper portion of said first barrier layer; carrying out a reoxidation process; and removing said nitride layer.

DETAILED DESCRIPTION OF THE PREFERRED EMBODMENTS

Hereinafter, the preferred embodiments in accordance with the present invention will be described in detail with reference to the accompanying drawings.

Figure 1A:
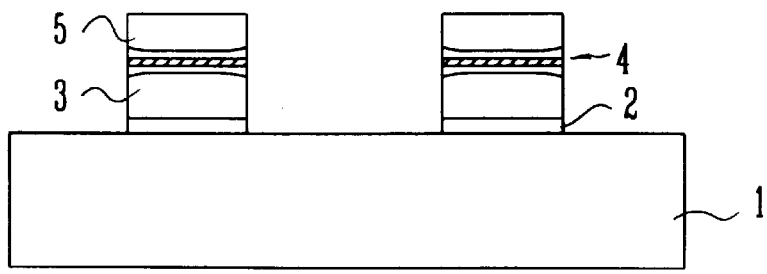
FIGS. 1A and 1B are cross-sectional views showing sequential steps for method of forming a gate in a conventional stack gate flash EEPROM cell.
Figure 1B:
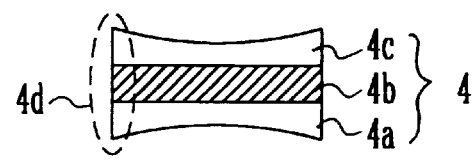
Figure 2A:
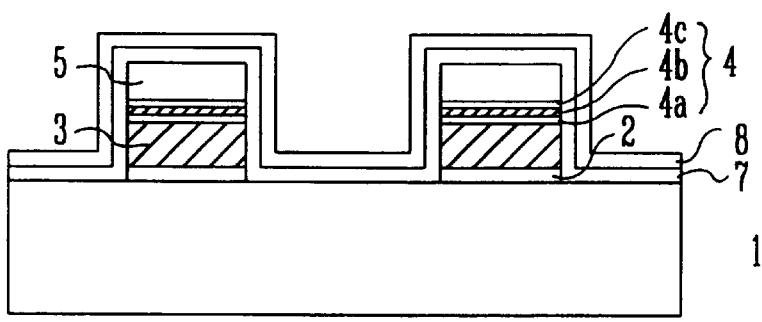
FIGS. 2A to 2C are cross-sectional views showing a method of forming a gate in a stack gate flash EEPROM cell in accordance with the present invention.
Figure 2B:
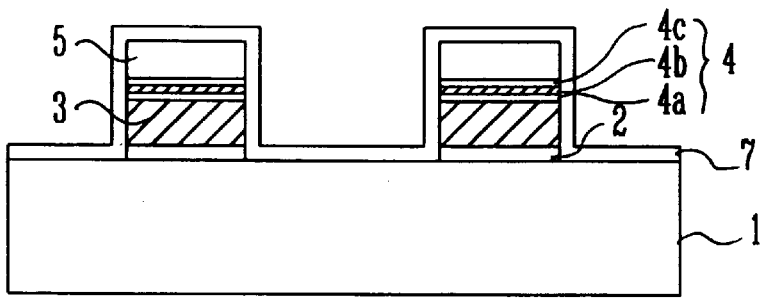
Figure 2C:
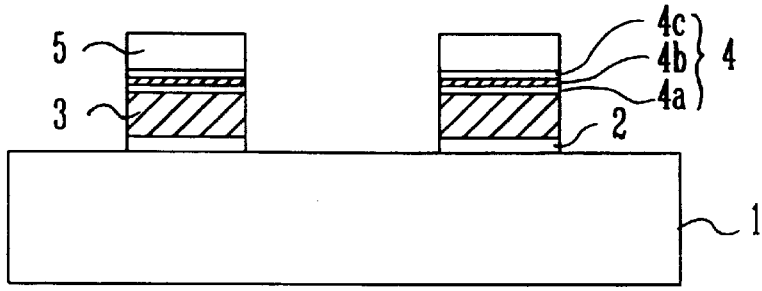

FIGS. 2A to 2C are cross-sectional views showing a method of forming a gate in a stack gate flash EEPROM cell in accordance with the present invention.

FIG. 2A is a cross-sectional view illustrating a stack gate formed by stacking a floating gate 3 and a control gate 5 on a semiconductor substrate 1. A tunnel oxide layer 2 is formed between the floating gate 3 and the semiconductor substrate 1. A dielectric layer 4 is formed between the floating gate 3 and the control gate 5. The dielectric layer 4 is an ONO structure formed by stacking a lower oxide layer 4a, a nitride layer 4b and an upper oxide layer 4c. Next, an oxide layer 7 as a first barrier layer is deposited on an entire upper portion including the cell gate to a thickness of 50 to 100 Å under a low temperature of below 775° C. Then, a nitride layer 8 as a second barrier layer is deposited on the upper portion of the oxide layer 7 to a thickness of 50 to 100 Å by using a CVD (chemical vapor deposition) method. At this point, the oxide layer 7 serves to protect the cell gate from impurities and to reduce a stress in the deposition of the nitride layer 8. The nitride layer 8 plays an important role in preventing the lateral bird's beak from occurring in the ONO dielectric layer 4 during the reoxidation process. At this point, if the thickness of the nitride layer 8 is very thick, when removing the nitride layer 8, the oxide layer 7 is removed together, so that the cell gate is influenced. In addition, with regard to a cell size, a proper thickness should be set by considering a gate to gate space.

Then, the reoxidation process is performed at a temperature of 850° C. to reduce a damage of the cell gate and to enable the deposited materials to be stabilized in itself.

FIG. 2B shows a cross-sectional view of the cell gate when the nitride layer 8 is entirely removed by using a wet or dry etching process in order to prepare an ion implantation for forming a junction region. The oxide layer 7 serves to protect the cell gate when the nitride layer 8 is removed.

FIG. 2C shows a cross-sectional view of the cell gate when a formation of the cell gate is completed without the lateral bird's beak of the ONO dielectric layer 4 by removing the oxide layer 7.

Meanwhile, as another embodiment of the present invention, the nitride layer 8 can be formed without time delay by depositing the oxide layer 6 through a low-temperature HDP (high density plasma), thereby preventing a pollution from particles and impurities when forming the barrier layer.

As described above, by depositing the oxide layer and the nitride layer after forming the cell gate and before the reoxidation process, the present invention protects the cell gate from impurities and can prevent the lateral bird's beak of the ONO dielectric layer during the reoxidation. Furthermore, by preventing the thickness of the ONO dielectric layer from being increased, the coupling ratio between the control gate and the floating gate is increased. Accordingly, even when a relatively low voltage is applied to the control gate, since the voltage applied to the floating gate is increased and thus the cell erase operation speed is remarkably improved.

What is claimed is:

1. A method of forming a gate in a stack gate flash EEPROM cell, comprising the steps of:

a) forming a cell gate having a stack structure, wherein the stack structure has a tunnel oxide layer, a floating gate, a dielectric layer and a control gate stacked on a semiconductor substrate;

b) forming an oxide layer as a first barrier layer on an entire upper portion including said cell gate;

c) forming a nitride layer as a second barrier layer on an upper portion of said first barrier layer;

d) carrying out a reoxidation process; and e) removing said nitride layer.

2. The method as recited in claim 1, wherein said oxide layer is deposited by using HDP.

3. The method as recited in claim 1, wherein said oxide layer is deposited at a low temperature of below 775° C.

4. The method as recited in claim 1, wherein said oxide layer is formed to a thickness of 50 to 100 Å.

5. The method as recited in claim 1, wherein said nitride layer is formed by using CVD method.

6. The method as recited in claim 1, wherein said nitride layer is formed to a thickness of 50 to 100 Å.

7. The method as recited in claim 1, wherein said oxide layer and said nitride layer are formed by performing a deposition process without time delay.

* * * * *